(12) United States Patent
Lin et al.

(10) Patent No.: US 11,094,654 B2
(45) Date of Patent: Aug. 17, 2021

(54) PACKAGE STRUCTURE AND METHOD OF MANUFACTURING THE SAME

(71) Applicant: Powertech Technology Inc., Hsinchu County (TW)

(72) Inventors: Nan-Chun Lin, Hsinchu County (TW); Hung-Hsin Hsu, Hsinchu County (TW); Shang-Yu Chang Chien, Hsinchu County (TW)

(73) Assignee: Powertech Technology Inc., Hsinchu County (TW)

( * ) Notice: Subject to any disclaimer, the term of this patent is extended or adjusted under 35 U.S.C. 154(b) by 138 days.

(21) Appl. No.: 16/529,796

(22) Filed: Aug. 2, 2019

(65) Prior Publication Data
US 2021/0035936 A1 Feb. 4, 2021

(51) Int. Cl.
*H01L 25/065* (2006.01)
*H01L 23/538* (2006.01)
(Continued)

(52) U.S. Cl.
CPC ............ *H01L 24/09* (2013.01); *H01L 21/565* (2013.01); *H01L 23/3107* (2013.01); *H01L 23/5381* (2013.01); *H01L 25/0655* (2013.01); *H01L 2224/02371* (2013.01); *H01L 2224/02379* (2013.01)

(58) Field of Classification Search
CPC ............... H01L 23/538; H01L 23/5381; H01L 23/5383; H01L 23/5386; H01L 25/0655; H05K 3/4685
See application file for complete search history.

(56) References Cited

U.S. PATENT DOCUMENTS

| 9,543,249 | B1 * | 1/2017 | Hu ...................... H01L 23/5384 |
| 9,763,319 | B2 * | 9/2017 | Inagaki .................. H05K 1/181 |

(Continued)

FOREIGN PATENT DOCUMENTS

| TW | I455279 | 10/2014 |
| TW | 201828375 | 8/2018 |

(Continued)

OTHER PUBLICATIONS

"Office Action of Taiwan Counterpart Application", dated Jan. 6, 2021, p. 1-p. 10.

*Primary Examiner* — Bryan R Junge
(74) *Attorney, Agent, or Firm* — JCIPRNET

(57) ABSTRACT

A package structure and a method of manufacturing the same are provided. The package structure includes a substrate, a redistribution layer (RDL) structure, a first die, an encapsulant and a plurality of conductive terminals. The RDL structure is disposed on and electrically connected to the substrate. A width of the RDL structure is less than a width of the substrate. The first die is disposed on the substrate and the RDL structure. The first connectors of the first die are electrically connected to the RDL structure. The second connectors of the first die are electrically connected to the substrate. A first pitch of two adjacent first connectors is less than a second pitch of two adjacent second connectors. The encapsulant is on the substrate to encapsulate the RDL structure and the first die. The conductive terminals are electrically connected to the first die through the substrate and the RDL structure.

18 Claims, 4 Drawing Sheets

(51) Int. Cl.
*H01L 23/00* (2006.01)
*H01L 23/31* (2006.01)
*H01L 21/56* (2006.01)

(56) References Cited

U.S. PATENT DOCUMENTS

| | | | |
|---|---|---|---|
| 2011/0089579 A1* | 4/2011 | Koide | H01L 23/66 257/786 |
| 2013/0168854 A1* | 7/2013 | Karikalan | H01L 24/73 257/738 |
| 2014/0167269 A1* | 6/2014 | Lu | H01L 25/0655 257/762 |
| 2014/0264769 A1* | 9/2014 | Chen | H01L 23/49805 257/620 |
| 2014/0360759 A1* | 12/2014 | Kunieda | H01L 21/4846 174/251 |
| 2015/0084210 A1* | 3/2015 | Chiu | H01L 25/0655 257/778 |
| 2016/0307870 A1 | 10/2016 | Kelly et al. | |
| 2017/0345771 A1* | 11/2017 | Hu | H01L 23/552 |
| 2018/0053723 A1* | 2/2018 | Hu | H01L 24/16 |
| 2018/0145031 A1 | 5/2018 | Braunisch et al. | |
| 2018/0294212 A1* | 10/2018 | Chen | H01L 23/49811 |
| 2019/0043829 A1 | 2/2019 | Kelly et al. | |
| 2019/0326221 A1* | 10/2019 | Bhagavat | H01L 21/485 |

FOREIGN PATENT DOCUMENTS

| | | |
|---|---|---|
| TW | 201832328 | 9/2018 |
| TW | 201907535 | 2/2019 |
| TW | 201923984 | 6/2019 |
| WO | 2016036667 | 3/2016 |

\* cited by examiner

PACKAGE STRUCTURE AND METHOD OF MANUFACTURING THE SAME

BACKGROUND

Technical Field

The disclosure generally relates to a package structure and a method of manufacturing the same.

Description of Related Art

Fan-out packaging technology is commonly used in packaging process. In a conventional fan-out packaging process, multiple redistribution layers (RDLs) are used to achieve electrical interconnection and power integrity performance. However, the cost of forming conventional RDLs is very high. On the other hand, during the conventional fan-out packaging process, a temporary carrier is used for supporting the in-process structure, and the temporary carrier is released by a de-bonding process after the package structure is formed, which also need cost and time. Currently, how to save the cost of packaging process is still a problem for the researchers in the field. Further, since current reticle size is limited, the fabrication of large size package has become a challenge in the field.

SUMMARY

The disclosure provides a package structure and a method of manufacturing the same, which can save the cost and achieve better signal integrity and power integrity, and can be applied for large size package.

The disclosure provides a package structure including a substrate, a redistribution layer (RDL) structure, a first die, an encapsulant and a plurality of conductive terminals. The RDL structure is disposed on and electrically connected to the substrate. A width of the RDL structure is less than a width of the substrate. The first die is disposed on the substrate and the RDL structure. The first die includes a plurality of first connectors and a plurality of second connectors. The first connectors are electrically connected to the RDL structure. The second connectors are electrically connected to the substrate. A first pitch of two adjacent first connectors is less than a second pitch of two adjacent second connectors. The encapsulant is disposed on the substrate to encapsulate the RDL structure and the first die. The conductive terminals are electrically connected to the first die through the substrate and the RDL structure.

The disclosure provides a method of manufacturing a package structure, which includes the following steps. A substrate is provided. The substrate has a first area and a second area. A RDL structure is formed within the first area of the substrate by the following processes. A polymer layer is formed on the substrate within the first area. A redistribution layer is formed to penetrate through the polymer layer to electrically connect to the substrate. A first die is bonded to the RDL structure and the substrate by the following processes. A plurality of first connectors of the first die are bonded to the RDL structure. A plurality of second connectors of the first die are bonded to the substrate within the second area. A first pitch of two adjacent first connectors is less than a second pitch of two adjacent second connectors. An encapsulant is formed on the substrate to encapsulate the RDL structure and the first die. A plurality of conductive terminals are formed to electrically connect to the first die through the substrate and the RDL structure.

In view of above, a combination of the substrate and RDL structure is used in the package structure. The connectors of the die having fine pitch are connected to the RDL structure, and the connectors of the die having coarse pitch are connected to the substrate, so as to achieve better signal integrity and power integrity. In addition, since some connectors of the die are connected to the substrate, the layers of the redistribution layers of the RDL structure can be reduced, thereby reducing the cost. Further, the RDL structure is formed within a local area of the substrate, and has an area much less than the package structure, therefore, the fabrication of the RDL structure is not affected by exposure reticle size limitation, which is suitable for the large size package application.

On the other hand, the substrate serves as the supporting carrier during the packaging process. Therefore, temporary carrier is not needed, and the temporary carrier de-bonding process is omitted, which can also reduce the cost of the package fabrication.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

FIG. 1A to FIG. 1D are schematic cross-sectional views illustrating a method of manufacturing a package structure according to some embodiments of the disclosure.

Figure 1A:
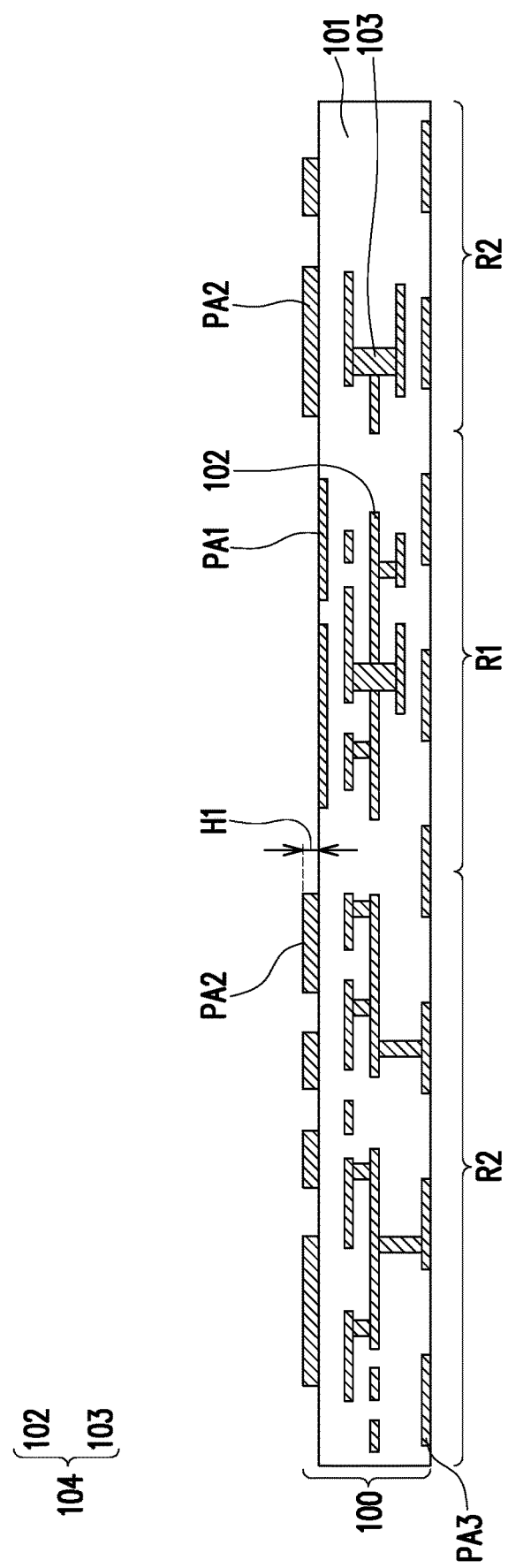
FIG. 1A to FIG. 1D are schematic cross-sectional views illustrating a method of manufacturing a package structure according to some embodiments of the disclosure.

Referring to FIG. 1A, a substrate 100 is provided. The substrate 100 is, for example, a circuit board substrate. In some embodiments, the substrate 100 provides electrical connection in the package structure to be formed, and also serve as a supporting carrier during the subsequent packaging process. In some embodiments, the substrate 100 includes a dielectric structure 101 and a plurality of conductive features 104. The dielectric structure 101 includes a plurality of dielectric layers stacked on one another. The dielectric layers may include a core dielectric material, a polymer material such as polyimide (PI), polybenzoxazole (PBO), benzocyclobutene (BCB), or a combination thereof. The conductive features 104 are disposed in and/or on the dielectric structure 101 and are electrically connected to each other. The conductive features 104 include copper, aluminum, or other suitable metallic materials or combinations thereof. The substrate 100 may be a laminated substrate formed by lamination processes.

In some embodiments, the conductive features 104 include a plurality of conductive layers 102 and a plurality of conductive vias 103 interconnected to each other. The conductive layers 102 in different layers are electrically connected to each other through the conductive vias 103. The conductive layers 102 may also be referred to as traces. In some embodiments, the conductive layers 102 have a relatively coarse pitch. For example, the line/space (L/S) of the conductive layers 102 may range from 10 µm/10 µm to 15 µm/15 µm, such as 12 µm/12 µm. It is noted that, the number of the layers of the conductive layers 102 shown in FIG. 1A is merely for exemplary illustration, and the disclosure is not limited thereto.

In some embodiments, the substrate 100 includes a plurality of conductive pads exposed at top surface and bottom surface of the dielectric structure 101 for further electrical connection. For example, a plurality of the conductive pads PA1 and a plurality of conductive pads PA2 are exposed at the top surface of the dielectric structure 101, and a plurality of conductive pads PA3 are exposed at the bottom surface of the dielectric structure 101. The conductive pads PA1, PA2, PA3 are electrically connected to the conductive layers 102 through the conductive vias 103. In some embodiments, the conductive pads PA1 and PA2 may be referred to as the topmost conductive feature of the conductive layers 102, and the conductive pads PA3 may be referred to as the bottommost conductive feature of the conductive layer 102. In some embodiments, the substrate 100 includes solder resist layers (not shown) on the top surface and bottom surface of dielectric structure 101 to provide protection for the conductive pads. The solder resist layer may cover portions of the conductive pads, and other portions of the conductive pads are exposed by the solder resist layer for further electrical connection.

In some embodiments, the substrate 100 includes a first area R1 and a second area R2. The second area R2 is, for example, surrounding the first area R1. The conductive pads PA1 are located within the first area R1, and the conductive pads PA2 are located within the second area R2. In some embodiments, the conductive pads PA1 are signal pads, and the connective pads PA2 include power pads, ground pads or a combination thereof.

As illustrated in FIG. 1A, the top surfaces of the conductive pads PA2 are higher than the top surfaces of the conductive pads PA1, and a height difference H1 is existed between the top surface of the conductive pad PA2 and the top surface of the conductive pad PA1. In some embodiments, the conductive pad PA2 may be thicker than the conductive pad PA1. In some embodiments, the conductive pads PA1 may be embedded in the substrate 100, and the top surfaces of the conductive pads PA1 may be substantially coplanar with the top surface of the dielectric structure 101, while the conductive pads PA2 protrude from the top surface of the dielectric structure 101. In alternative embodiments, both the conductive pads PA1 and the conductive pads PA2 protrude from the top surface of the dielectric structure 101, and the conductive pad PA2 has a thickness larger than a thickness of the conductive pad PA1.

Figure 1B:
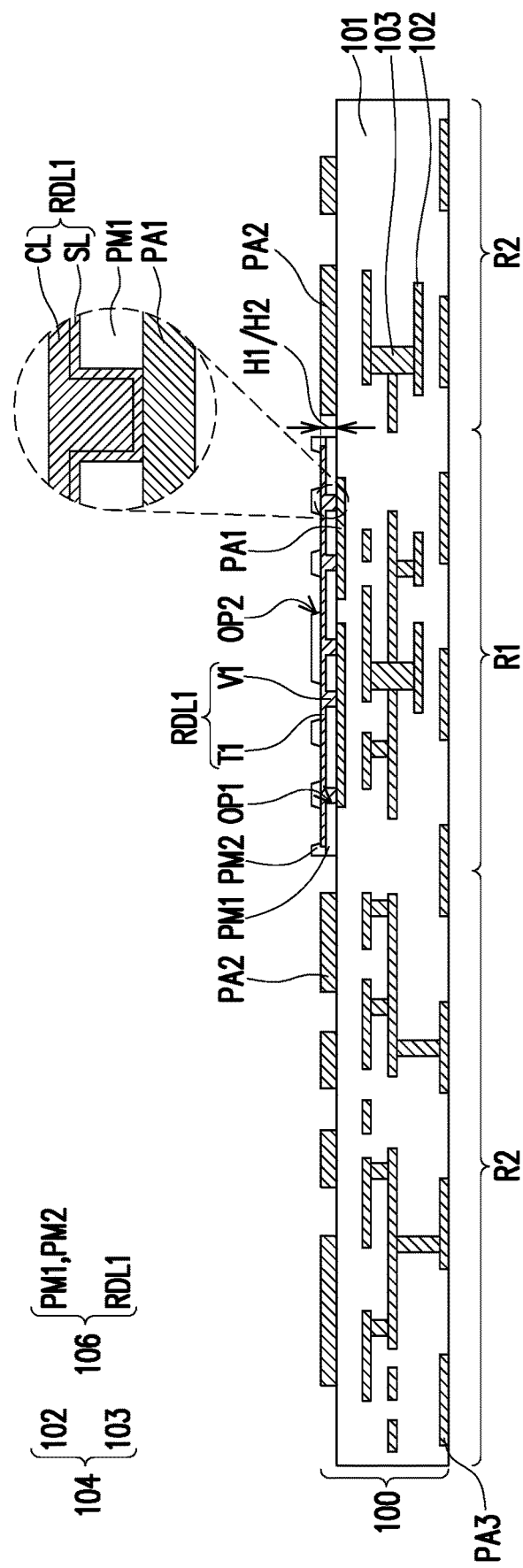

Referring to FIG. 1B, a redistribution layer (RDL) structure 106 is formed on the substrate 100. In some embodiments, the RDL structure 106 is formed within the first area R1 of the substrate 100, and is electrically connected to the substrate 100. The size (e.g. width or area) of the RDL structure 106 is less than the size (e.g. width or area) of the substrate 100. In some embodiments, the RDL structure 106 includes a plurality of polymer layers and redistribution layers stacked on one another. For example, the RDL structure 106 includes a polymer layer PM1, a redistribution layer RDL1 and a polymer layer PM2. The polymer layers PM1 and PM2 may include polybenzoxazole (PBO), poly-imide (PI), benzocyclobutene (BCB), a combination thereof or the like. The redistribution layer RDL1 includes conductive materials such as copper, nickel, titanium, a combination thereof or the like. In some embodiments, the redistribution layer RDL1 includes a seed layer SL and a conductive layer CL on the seed layer SL. The seed layer SL is a suitable metal seed layer, such as a copper seed layer including titanium and copper, the conductive layer CL may be a copper layer. It should be understood that, the numbers of the layers of the polymer layer and the redistribution layer illustrated in FIG. 1B is merely for exemplary illustration, and the disclosure is not limited thereto.

In some embodiments, the RDL structure 106 may be formed by the following steps. A first polymer material layer is formed on the top surface of the substrate 100 by a spin coating process, a deposition process or the like. Thereafter, a portion of the first polymer material layer is removed to form the polymer layer PM1 by, for example, lithography and etching processes or a laser illumination process. During the removal process, the first polymer material layer on the second area R2 of the substrate 100 are removed and the first polymer material layer on the first area R1 of the substrate 100 is patterned (that is, a portion of the first polymer material layer on the first area R1 is removed), such that the polymer layer PM1 is remained within the first area R1, and a plurality of openings OP1 are formed in the polymer layer PM1 to expose portions of the top surfaces of the conductive pads PA1.

Afterwards, the redistribution layer RDL1 is formed on the polymer layer PM1 and filled into the openings OP1. For example, a seed material layer is formed on the polymer layer PM1 and on the substrate 100 by physical vapor deposition such as sputtering. A patterned mask layer (such as a patterned photoresist) having openings is then formed on the seed material layer. The openings of the patterned mask layer expose a portion of the seed material layer on the polymer layer PM1 and the seed material layer in the openings OP1 of the polymer layer PM1. Thereafter, the conductive layer CL is formed on the seed material layer exposed by the openings of the patterned mask layer. The patterned mask layer is then stripped, and the seed material layer not covered by the conductive layer CL is removed by an etching process with the conductive layer CL as an etching mask. As such, the conductive layer CL and the remained seed layer SL underlying thereof constitute the redistribution layer RDL1. Next, the polymer layer PM2 is formed on the polymer layer PM1 and the redistribution layer RDL1 by a forming method similar to that of the polymer layer PM1.

Still referring to FIG. 1B, the polymer layer PM1 is located on and in physical contact with the top surface of the substrate 100. The redistribution layer RDL1 penetrates through the polymer layer PM1 to electrically connect to conductive pads PA1 of the substrate 100. In some embodiments, the seed layer SL of the redistribution layer RDL1 is in electrical and physical contact with the top surfaces of the conductive pads PA1 In some embodiments, the redistribution layer RDL1 includes a plurality of vias V1 and traces T1 connected to each other. The vias V1 are embedded in and penetrating through the polymer layer PM1, so as to be in physical and electrical contact with the conductive pads PA1 of the substrate 100. The traces T1 are extending on the top surface of the polymer layer PM1 and electrically connected to the conductive pads PA1 through the vias V1. The polymer layer PM2 is located on the polymer layer PM1 to partially cover the traces T1. In some embodiments, the polymer layer PM2 has a plurality of openings OP2. Each opening OP2 exposes a portion of the top surface of the redistribution layer RDL1.

In some embodiments, the pitch (L/S) of the traces T1 of the redistribution layer RDL1 is formed to be less than the pitch (L/S) of the conductive layers 102 of the substrate 100. In some embodiments, the redistribution layer RDL1 is formed to have a fine pitch. For example, the L/S of the redistribution layer RDL1 may be less than 5 µm/5 µm, such as 2 µm/2 µm. In some embodiments, the ratio of the pitch (L/S) of the traces T1 of the redistribution layer RDL1 to the pitch (L/S) of the conductive layers 102 of the substrate 100 ranges from 1/5 to 1/7, for example. In other words, the routing density of the traces T1 of the redistribution layer RDL1 is larger than the routing density of the conductive layers 102 of the substrate 100. In some embodiments, the thickness of the trace T1 of the redistribution layer RDL1 is less than the thickness of the conductive layer 102 of the substrate 100.

In some embodiments, the top surface of the redistribution layer RDL1 is substantially coplanar with the top surfaces of the conductive pads PA2. In the embodiments in which the RDL structure 106 includes multiple redistribution layers, the top surface of the topmost redistribution layer of the RDL structure 106 is substantially coplanar with the top surfaces of the conductive pads PA2. In other words, the height H2 of the redistribution layers (such as RDL1) of the RDL structure 106 is substantially equal to the height difference H1 between the top surface of the conductive pad PA2 and the top surface of the conductive pad PA1 The height H1 of the redistribution layers of the RDL structure 106 refers to the distance between the top surface of the topmost redistribution layer to the bottom surface of the bottommost redistribution layer in a direction perpendicular to the top surface of the substrate 100.

Figure 1C:
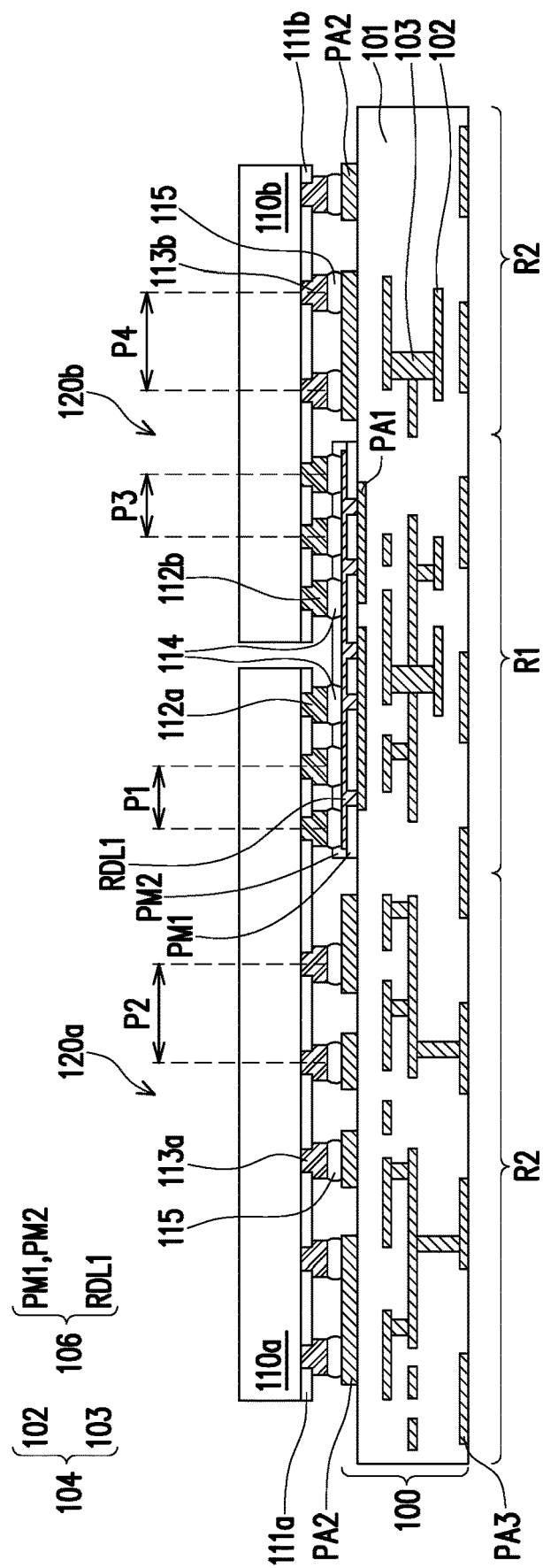

Referring to FIG. 1C, a plurality of dies 120a and 120b are electrically connected to the substrate 100 and the RDL structure 106 through a plurality of connectors 114 and 115. Each of the dies 120a and 120b may be digital die, analog die, or mixed signal die. For example, each of the dies 120a and 120b may be application-specific integrated circuit (ASIC) die, logic die, system-on-chip (SoC), a memory die such as a dynamic random access memory (DRAM) die, or other suitable dies. The dies 120a and 120b may be the same or similar types of dies or different types of dies. In an exemplary embodiment, the die 120a is a SoC, and the die 120b is a DRAM die. In some embodiments, the dies 120a and 120b have similar structures, and the detailed structure of the die is described as below taken the die 120a as an example.

In some embodiments, the die 120a includes a substrate 110a, a passivation layer 111a and a plurality of connectors 112a and 113a. The substrate 110a is a semiconductor substrate, such as a silicon substrate. Active devices (such as transistors or the like), passive devices (such as resistors, capacitors, inductors, or the like) or combinations thereof may be formed in the substrate 110a. The plurality of connectors 112a and 113a are formed over the substrate 110a and electrically coupled to the devices in the substrate 110a. For example, the connectors 112a and 113a may be coupled to the devices through an interconnection structure (not shown) disposed between the substrate 110a and the connectors 112a and 113a. In some embodiments, a portion of each connector 112a/113a is embedded in the passivation layer 111a, and another portion of each connector 112a/113a is exposed for further electrical connection.

Similarly, the die 120b includes a substrate 110b, a passivation layer 111b and a plurality of connectors 112b and 113b over the substrate 110b.

Still referring to FIG. 1C, in some embodiments, the pitch P1 between two adjacent connectors 112a is less than the pitch P2 between two adjacent connectors 113a of the die 120a. The pitch P3 between two adjacent connectors 112b is less than the pitch P4 between two adjacent connectors 113b of the die 120b. In some embodiments, the pitch P1 of the connectors 112a and the pitch P3 of the connectors 112b are fine pitches, and may be the same as or different from each other. The pitch P2 of the connectors 113a and the pitch P4 of the connectors 113b are coarse pitches, and may be the same as or different from each other. The pitch of the connectors described herein refers to the distance from a center of the connector to a center of next immediately adjacent connector. In some embodiments, the bottom surfaces of the connectors 112a, 113a, 112b and 113b may be substantially coplanar with each other. The heights of the connectors 112a, 113a, 112a and 113b may be substantially the same. In some embodiments, the connectors 112a and the connectors 112b are signal input/outputs (I/Os), and the connectors 113a and 113b may respectively include power I/Os and ground I/Os.

Still referring to FIG. 1C, in some embodiments, the dies 120a and 120b are bonded to the substrate 100 and the RDL structure 106 in a flip-chip manner, that is, the active surfaces of the dies 120a and 120b faces the substrate 100 and the RDL structure 106, and the rear surfaces of the dies 120a and 120b faces upward. The active surface of the die refers to the surface having connectors, and the rear surface of the die refers to the surface opposite to the active surface. As illustrated in FIG. 1C, the connectors 112a of the die 120a and the connectors 112b of the die 120b are electrically bonded to the RDL structure 106 through the connectors 114. The connectors 114 fill into the openings OP2 (FIG. 1B) of the polymer layer PM2, so as to provide electrical connection between the connectors 112a/112b and the redistribution layer RDL1. The connectors 113a of the die 120a and the connectors 113b of the die 120b are electrically bonded to the conductive pads PA2 of the substrate 100 through the connectors 115. The connectors 115 are located between the connectors 113a/113b and the conductive pads PA2 to provide the electrical connection.

In some embodiments, the connectors 114 and 115 may be solder bumps, or any other suitable metallic bumps. The bonding of the dies 120a and 120b to the substrate 100 and the RDL structure 106 through the connectors 114 and 115 may be performed by a soldering process, and a reflow process may be performed to enhance the adhesion between the connectors 114 and the connectors 112a/112b, the adhesion between the connectors 114 and the redistribution layer RDL1, the adhesion between the connectors 115 and the connectors 113a/113b, and the adhesion between the connectors 115 and the conductive pads PA2. Since the top surfaces of the conductive pads PA2 and the top surface of the redistribution layer RDL1 are formed to be coplanar, and bottom surfaces of the connectors of the dies are formed to be coplanar, the cold joint issue is avoided. In some embodiments, the connectors 114 and 115 have the same height, the top surfaces of the connectors 114 and 115 may be substantially coplanar with each other, and the bottom surfaces of the connector 114 and 115 may be substantially coplanar with each other.

As such, the die 120a and the die 120b are electrically coupled to each other through the RDL structure 106 and the substrate 100. Specifically, the RDL structure 106 provides the connection between the connectors 112a of the die 120a and the connectors 112b of the die 120b. The substrate 100 provides the connection between the connectors 113a of the die 120a and the connectors 113b of the die 120b.

Figure 1D:
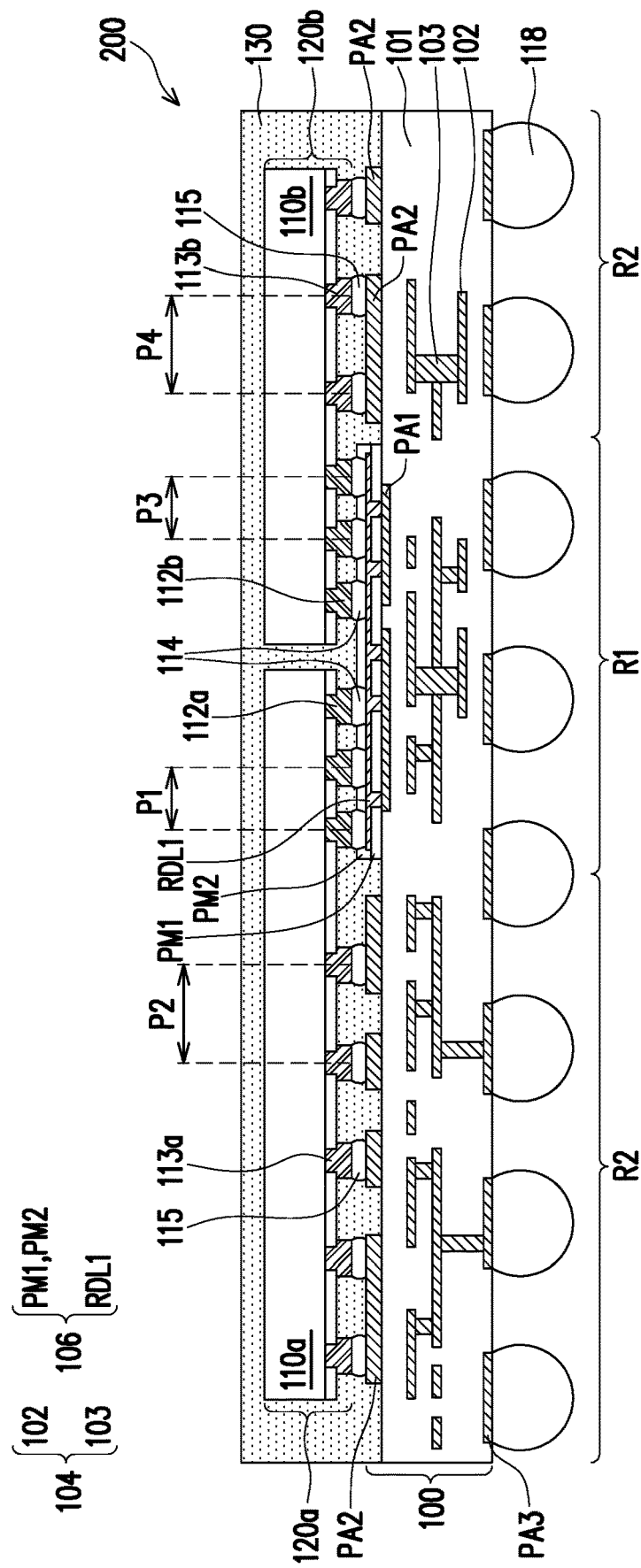

Referring to FIG. 1D, an encapsulant 130 is formed on the substrate 100 to encapsulate the dies 120a and 120b, the RDL structure 106 and the connectors 114 and 115. The encapsulant 110 may include a molding compound, a molding underfill or an insulating material such as epoxy, silicone, or other suitable resins. The encapsulant 110 may be formed by a molding process or other suitable process. In some embodiments, the encapsulant 130 encapsulates the top surface of the substrate 100, the sidewalls and top surface of the RDL structure 106, the sidewalls of the connectors 114 and 115, the sidewalls, active surfaces and rear surfaces of the dies 120a and 120b. As illustrated in FIG. 1D, the rear surfaces of the dies 120a and 120b are encapsulated by the encapsulant 130, but the disclosure is not limited thereto. In alternative embodiments, the top surface of encapsulant 130 may be configured as coplanar with the rear surfaces of the dies 120a and 120b.

A plurality of conductive terminals 118 are formed on the substrate 100 at a side opposite to the dies 120a and 120b. In some embodiments, the conductive terminals 118 are formed on and electrically connected to the conductive pads PA3 of the substrate 100. The conductive terminals 118 are electrically connected to the RDL structure 106 and the dies 120a and 120b through the substrate 100 and the RDL structure 106. In some embodiments, the conductive terminals 118 are formed within the first area R1 and the second area R2 of the substrate 100. That is to say, some of the conductive terminals 118 are overlapped with the RDL structure 106 and portions of the dies 120a and 120b having connectors 112a and 112b in a direction perpendicular to the top surface of the substrate 100, some of the conductive terminals 118 are overlapped with portions of the dies 120a and 120b having connectors 113a and 113b and are not overlapped with the RDL structure 106 in the direction perpendicular to the top surface of the substrate 100. In some embodiments, the conductive terminals 118 may be solder balls, ball grid array (BGA) balls, or the like, and may be formed by a ball placement process and a reflow process. However, the disclosure is not limited thereto. Other suitable types of the conductive terminals may be alternatively or additionally used.

Still referring to FIG. 1D, a package structure 200 is thus formed. The package structure 200 is a fan-out package structure. In some embodiments, the package structure 200 includes the substrate 100, the RDL structure 106, the dies 120a and 120b, the encapsulant 130, and the conductive terminals 118. The die 120a and the die 120b are electrically coupled to each other through the RDL structure 106 and the substrate 100. The conductive terminals 118 are electrically connected to the dies 120a and 120b through the substrate 100 and the RDL structure 106.

The substrate 100 includes the first area R1 and the second area R2. The first area R1 may be surrounded by the second area R2. In some embodiments, the first area R1 may be referred to as fine pitch area on which fine pitch elements are disposed, and the second area R2 may be referred to as coarse pitch area on which coarse pitch elements are disposed. The conductive pads (such as signal pads) PA1 of the substrate 100 in the first area R1 are electrically connected to the RDL structure 106 and further connected to the connectors 112a and 112b (such as signal I/Os) of the dies 120a and 120b. The conductive pads (such as power pads and ground pads) PA2 of the substrate 100 in the second area R2 are electrically connected to the connectors 113a and 113b (such as power I/Os and ground I/Os) of the dies 120a and 120b. The conductive pads PA2 are laterally aside the RDL structure 106, and the top surface and sidewalls of the conductive pads PA2 are encapsulated by the encapsulant 130.

The RDL structure 106 is disposed within the first area R1 of the substrate 100. In some embodiments, the RDL structure 106 is laterally surrounded by the conductive pads PA2, and the top surface and sidewalls of the RDL structure 106 is encapsulated by the encapsulant 130. The size (e.g. width, area) of the RDL structure 106 is less than the size (e.g. width, area) of the package structure 200. Therefore, even though the package structure 200 has a large size, the RDL structure 106 may have a relatively smaller size, and the fabrication of the RDL structure 106 is not affected by the current reticle size limitation. In some embodiments, the package structure 200 may have a large size, such as greater than 60×60 mm.

In some embodiments, signal interconnection between the die 120a and 120b are achieved through the RDL structure 106. Since the RDL structure 106 has a fine pitch, the signal integrity is improved. In some embodiments, some of the signals output from the dies 120a and 120b may be transmitted through the RDL structure 102 and the substrate 100 to the conductive terminals 118. In other words, the package structure 200 includes a first signal transmitting path from the die 120a or 120b through the RDL structure 106 to the die 120b or 120a, and a second signal transmitting path from the die 120a and/or the die 120b through the RDL structure 106 and the substrate 100 to the conductive terminals 118. In some embodiments, the conductive terminals 118 may further be coupled to other devices or packages, and signals may also be transmitted from other device or packages through the conductive terminals 118, the substrate 100 and the RDL structure 106 to the die 120a and/or the die 120b via the second signal transmitting path. It is noted that, most of the signal transmitting is conducted through the first signal transmitting path via the RDL structure 106 which has a fine pitch, such that better signal integrity is achieved.

The connectors 113a and 113b (i.e. power and/or ground connectors) of the dies 120a and 120b are electrically connected to the conductive pads PA2 (i.e. power pads) of the substrate 100. That is, power transmitting is conducted through the substrate 100. Since the conductive layers 102 of the substrate have coarse pitch, better power integrity is achieved.

In the embodiments of the disclosure, a combination of the circuit board substrate and RDL structure is used in the package structure, wherein the circuit board substrate having conductive layers with coarse pitch is configured for transmitting power and ground, and the RDL structure having traces with fine pitch is configured for transmitting signal. Therefore, the electrical power integrity and signal integrity are improved. In addition, the RDL structure is specifically used for signal I/O interconnection, and is not used for power or ground I/O interconnection, the layers of the redistribution layers may be reduced, thereby reducing the cost, and better yield is achieved. Further, the RDL structure is formed within a local area of the substrate, and has an area much less than the package structure. As such, the manufacturing method of the disclosure is suitable for forming package structure having large size, because exposure reticle size limitation can be avoided.

On the other hand, laminated substrate can achieve better on board reliability, and the substrate also serves as the supporting carrier during the packaging process. Therefore, temporary carrier is not needed, and the temporary carrier de-bonding process is omitted, which can reduce the cost of the package fabrication.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A package structure, comprising:
a substrate;
a redistribution layer (RDL) structure disposed on and electrically connected to the substrate, wherein a width of the RDL structure is less than a width of the substrate;
a first die on the substrate and the RDL structure, comprising:
a plurality of first connectors electrically connected to the RDL structure; and
a plurality of second connectors electrically connected to the substrate,
wherein a first pitch of two adjacent first connectors is less than a second pitch of two adjacent second connectors;
an encapsulant on the substrate, encapsulating the RDL structure and the first die; and
a plurality of conductive terminals, electrically connected to the first die through the substrate and the RDL structure, wherein:
the substrate comprises a first conductive pad and a second conductive pad exposed at a top surface of the substrate;
the first conductive pad is connected to a redistribution layer of the RDL structure;
the second conductive pad is electrically bonded to the second connectors of the first die; and
a top surface of the second conductive pad is higher than a top surface of the first conductive pad.

2. The package structure of claim 1, wherein the RDL structure comprises a redistribution layer, the substrate comprises a conductive layer, and a pitch of the redistribution layer is less than a pitch of the conductive layer.

3. The package structure of claim 1, wherein the top surface of the second conductive pad is coplanar with a top surface of the redistribution layer.

4. The package structure of claim 3, wherein the redistribution layer is a topmost redistribution layer of the RDL structure.

5. The package structure of claim 1, wherein the redistribution layer comprises a seed layer and a conductive layer on the seed layer, and the seed layer is in contact with the first conductive pad of the substrate.

6. The package structure of claim 1, wherein the first connectors include signal input/outputs, the second connectors include power input/outputs and ground input/outputs.

7. The package structure of claim 1, wherein some of the plurality of conductive terminals are overlapped with the RDL structure in a direction perpendicular to the top surface of the substrate.

8. The package structure of claim 1, further comprises a second die on the substrate and the RDL structure, the second die is laterally aside the first die and encapsulated by the encapsulant, wherein the second die comprises:
a plurality of third connectors electrically connected to the RDL structure; and
a plurality of fourth connectors electrically connected to the substrate,
wherein a third pitch of two adjacent third connectors is less than a fourth pitch of two adjacent fourth connectors.

9. The package structure of claim 8, comprising:
a first signal transmitting path from the first connectors of the first die through the RDL structure to the third connectors of the second die; and
a second signal transmitting path from the first connectors of the first die and the third connectors of the second die through the RDL structure and the substrate to the conductive terminals.

10. A method of manufacturing a package structure, comprising:
providing a substrate, wherein the substrate has a first area and a second area;
forming a RDL structure within the first area of the substrate, comprising:
forming a polymer layer on the substrate within the first area; and
forming a redistribution layer penetrating through the polymer layer to electrically connect to the substrate,
bonding a first die to the RDL structure and the substrate, comprising:
bonding a plurality of first connectors of the first die to the RDL structure; and
bonding a plurality of second connectors of the first die to the substrate within the second area,
wherein a first pitch of two adjacent first connectors is less than a second pitch of two adjacent second connectors;
forming an encapsulant on the substrate to encapsulate the RDL structure and the first die; and
forming a plurality of conductive terminals to electrically connect to the first die through the substrate and the RDL structure, wherein the redistribution layer is connected to a first conductive pad of the substrate, the second connectors of the first die are connected to a second conductive pad of the substrate, and a top surface of the second conductive pad is higher than a top surface of the first conductive pad.

11. The method of claim 10, wherein forming the polymer layer comprises:
forming a polymer material layer on the first area and the second area of the substrate;
removing the polymer material layer on the second area of the substrate and a portion of the polymer material layer on the first area of the substrate, such that the polymer layer having an opening is remained on the first area of the substrate, wherein the opening exposes a portion of the first conductive pad of the substrate.

12. The method of claim 11, wherein forming the redistribution layer comprises:
forming a seed layer on the polymer layer, the seed layer lines the opening and contacts the portion of the first conductive pad; and
forming a conductive layer on the seed layer.

13. The method of claim 10, wherein the substrate comprises a conductive layer, and the redistribution layer of RDL structure is formed to have a pitch less than a pitch of the conductive layer of the substrate.

14. The method of claim 10, wherein the top surface of the second conductive pad is coplanar with a top surface of the redistribution layer.

15. The method of claim 10, wherein before forming the encapsulant, further comprising:

bonding a second die to the RDL structure and the substrate, comprising:
  bonding a plurality of third connectors of the second die to the RDL structure; and
  bonding a plurality of fourth connectors of the second die to the substrate in the second area,
wherein a third pitch of two adjacent third connectors is less than a fourth pitch of two adjacent fourth connectors, wherein the first die and the second die are disposed side by side.

16. The method of claim 10, wherein the substrate serves as a circuit board substrate in the package structure as well as a supporting carrier during packaging processes.

17. The method of claim 16, wherein the method does not use a temporary supporting carrier and is free of a temporary supporting carrier de-bonding process.

18. The method of claim 10, wherein the plurality of conductive terminals are formed within the first area and the second area of the substrate.

\* \* \* \* \*